(12) United States Patent
Briggs et al.

(10) Patent No.: US 9,685,366 B1
(45) Date of Patent: Jun. 20, 2017

(54) FORMING CHAMFERLESS VIAS USING THERMALLY DECOMPOSABLE POREFILLER

(71) Applicant: International Business Machines Corporation, Armonk, NY (US)

(72) Inventors: Benjamin D. Briggs, Waterford, NY (US); Lawrence A. Clevenger, Rhinebeck, NY (US); Bartlet H. DeProspo, Goshen, NY (US); Huai Huang, Saratoga, NY (US); Christopher J. Penny, Saratoga Springs, NY (US); Michael R. Rizzolo, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/134,534

(22) Filed: Apr. 21, 2016

(51) Int. Cl.
*H01L 21/768* (2006.01)

(52) U.S. Cl.
CPC .. *H01L 21/76808* (2013.01); *H01L 21/76828* (2013.01); *H01L 21/76879* (2013.01)

(58) Field of Classification Search
None
See application file for complete search history.

(56) References Cited

U.S. PATENT DOCUMENTS

| | | | |
|---|---|---|---|
| 6,150,252 A | 11/2000 | Hsu et al. | |
| 6,187,666 B1 | 2/2001 | Singh et al. | |
| 6,815,329 B2 | 11/2004 | Babich et al. | |
| 6,852,619 B2 | 2/2005 | Okabe | |
| 7,018,918 B2 | 3/2006 | Kloster et al. | |
| 7,169,698 B2 | 1/2007 | Gambino et al. | |
| 7,214,603 B2 | 5/2007 | Dellaguardia et al. | |
| 7,517,736 B2 | 4/2009 | Mehta et al. | |
| 8,835,305 B2 | 9/2014 | Yang et al. | |
| 2009/0321945 A1* | 12/2009 | Besling | H01L 21/76808 257/774 |
| 2013/0045608 A1* | 2/2013 | Dubois | H01L 21/3105 438/781 |
| 2016/0185984 A1* | 6/2016 | Aqad | C09D 5/34 524/612 |

OTHER PUBLICATIONS

Huang et al., Implementation of Air-Gap Through-Silicon-Vias (TSVs) Using Sacrificial Technology, IEEE Transactions on Components, Packaging and Manufacturing Technology, vol. 3, No. 8, Aug. 2013, © 2013 IEEE, pp. 1430-1438.

* cited by examiner

*Primary Examiner* — Charles Garber
*Assistant Examiner* — Alia Sabur
(74) *Attorney, Agent, or Firm* — Gilbert Harmon, Jr.

(57) ABSTRACT

A method for forming chamferless vias comprises receiving a substrate stack comprising a hard mask layer, a porous dielectric layer underlying the hard mask layer, a cap layer underlying the dielectric layer, and a conductive layer underlying the cap layer. The hard mask layer is opened to reveal a portion of the dielectric layer. A plurality of vias are opened to extend through the dielectric layer and the cap layer. A pore filling material comprising a thermally decomposable polymer is deposited into the vias. The pore filling material in the vias is hardened and driven into the pores of the dielectric layer adjacent to the vias by an annealing process. The hard mask layer is removed. A trench is patterned and etched coincident with the vias. A dissipation process is conducted to remove the pore filling material.

11 Claims, 5 Drawing Sheets ered stack; opening (110) a hard mask layer to reveal a
FORMING CHAMFERLESS VIAS USING THERMALLY DECOMPOSABLE POREFILLER

BACKGROUND

The present disclosure relates generally to the field of semiconductor devices, and more particularly to methods for forming chamferless vias.

As the dimensions of integrated circuits shrink, minimum insulator requirements become important and via to line spacing must be controlled. Chamferless vias can be fabricated as a solution; however, conventional approaches to forming chamferless vias have certain weaknesses such as: (i) resulting in increased critical dimensions during wet clean; (ii) leaving residual plug fill materials; (iii) resulting in differing chamfer angles between dense and isolated vias; (iv) resulting in liner punch through at the trench bottom; and/or (v) damaging and removing dielectric layers.

SUMMARY

A method for forming chamferless vias includes receiving a substrate stack comprising a hard mask layer, a porous dielectric layer underlying the hard mask layer, a cap layer underlying the dielectric layer, and a conductive layer underlying the cap layer. The hard mask layer is opened to reveal a portion of the dielectric layer. A plurality of vias are opened to extend through the dielectric layer and the cap layer. A pore filling material comprising a thermally decomposable polymer is deposited into the vias. The pore filling material in the vias is hardened and driven into the pores of the dielectric layer adjacent to the vias by an annealing process. The hard mask layer is removed. A trench is patterned and etched coincident with the vias. A dissipation process is conducted to remove the pore filling material.

DETAILED DESCRIPTION

Embodiments described herein enable formation of chamferless vias in a dielectric material using a thermally decomposable pore filling material, such that the pore filling material acts as a structural reinforcement agent for the dielectric material.

It should be noted that references throughout this specification to features, advantages, or similar language herein do not imply that all of the features and advantages that may be realized with the embodiments disclosed herein should be, or are in, any single embodiment of the invention. Rather, language referring to the features and advantages is understood to mean that a specific feature, advantage, or characteristic described in connection with an embodiment is included in at least one embodiment of the present invention. Thus, discussion of the features, advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following drawings, description and appended claims, or may be learned by the practice of the invention as set forth hereinafter.

The scope of the present invention is to be determined by the claims. Accordingly, any features, characteristics, advantages, or the like, discussed below in the discussion of embodiments of this specification shall not be taken to mean that such features, characteristics, advantages, or the like are required to practice the present invention as defined by the claims.

Figure 1:
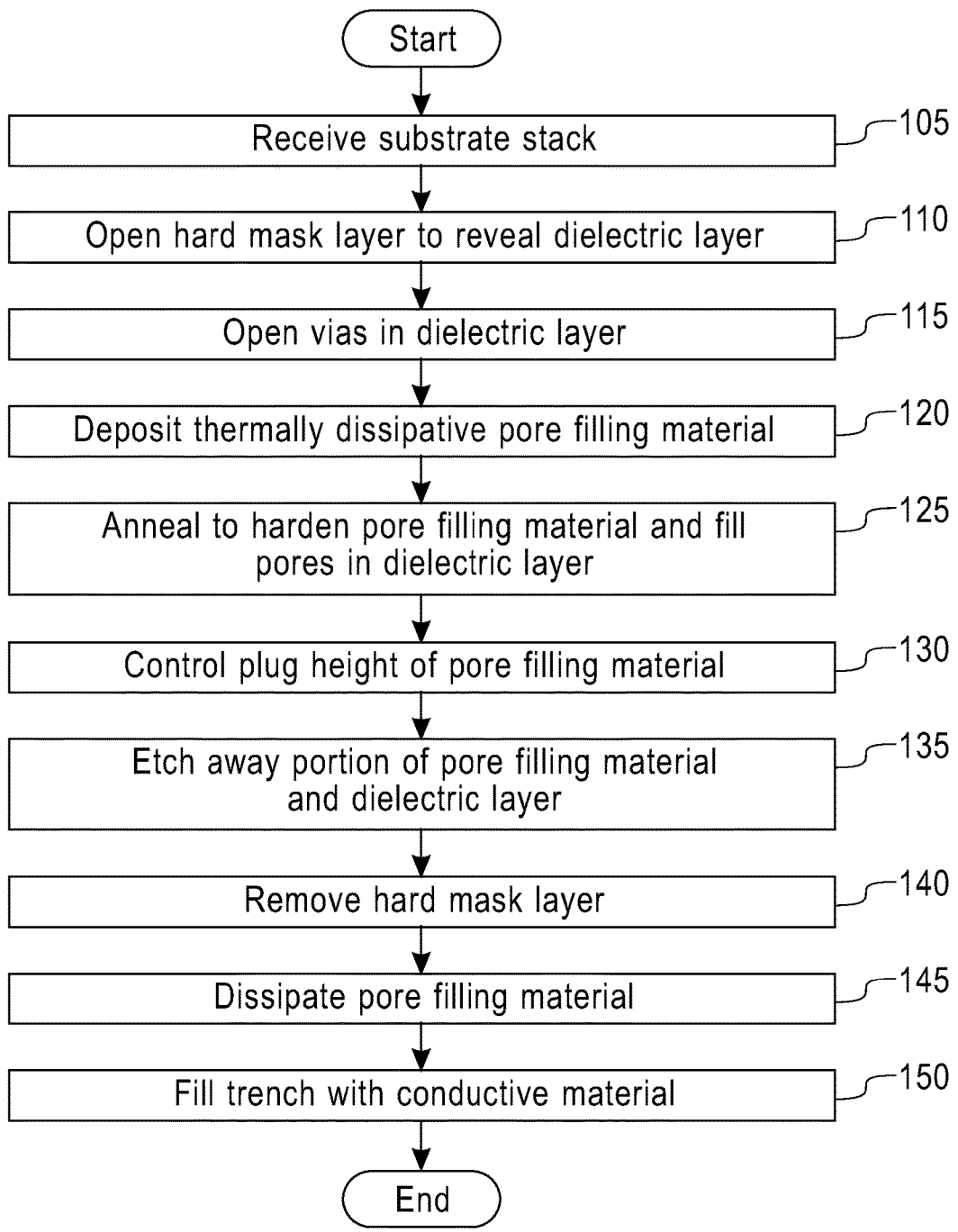
FIG. 1 is a flowchart depicting a method for forming chamferless vias, in accordance with at least one embodiment of the present invention.

Embodiments of the present invention are described with reference to the Figures. FIG. 1 is a flowchart depicting an embodiment of a method 100 for forming chamferless vias. As depicted, method 100 includes receiving (105) a substrate stack; opening (110) a hard mask layer to reveal a portion of a dielectric layer; opening (115) a plurality of vias; depositing (120) a pore filling material into the vias; annealing (125) the pore filling material; controlling (130) the plug height of the pore filling material; patterning and etching (135) a trench coincident with the vias; removing (140) the hard mask layer; dissipating (145) the pore filling material; and filling (150) the trench with a conductive material.

Receiving (105) a substrate stack may include receiving a substrate with various layers formed thereon such as: (i) a porous, ultra-low-k (i.e., ultra-low dielectric constant) dielectric material ("ULK" or "ULK layer"); (ii) a hard mask layer comprising $SiO_2$, SiCOH, TiN, SiN and/or another similarly suitable material overlying the ULK layer; and (iii) a conductive (e.g., copper) layer underlying the ULK layer. The ULK layer may be separated from the conductive layer by a cap (i.e., barrier) layer comprising another dielectric material, if it is not desired that the ULK layer come directly into contact with the conductive layer. Suitable materials for the cap layer may include, for example but without limitation, SiCN, SiN, SiC, SiCNH, and SiNO.

Opening (110) the hard mask layer may include revealing a portion of the ULK layer by reactive ion etching (RIE) to remove a portion of the hard mask layer, wherein the portion of the hard mask layer removed defines the opening of a trench to be formed in patterning and etching operation 135

Figure 2:
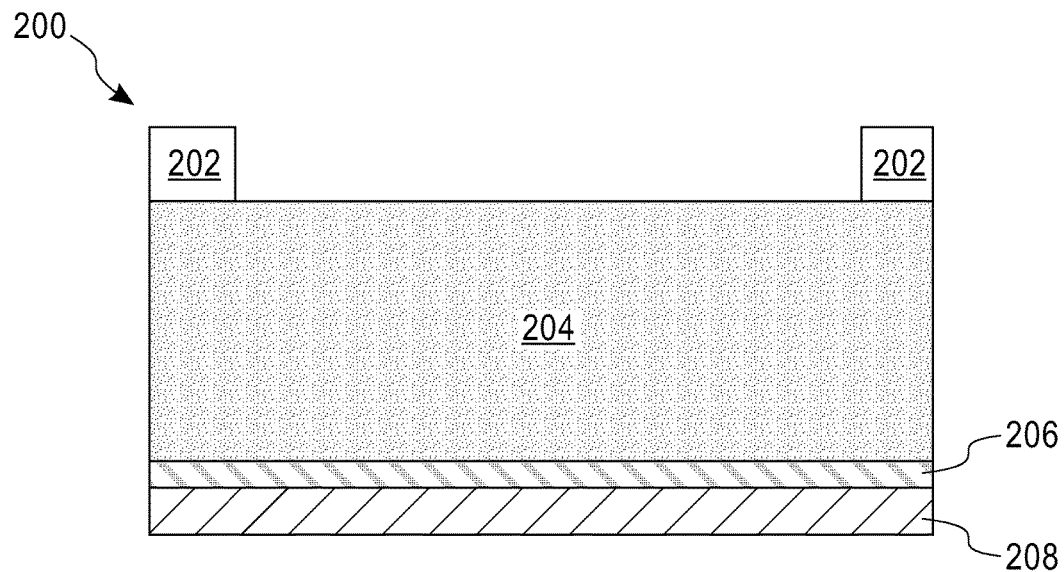
FIG. 2 is a cross-sectional view depicting a first opening operation for an embodiment of the method of FIG. 1.

(described herein). Additional details of opening operation 110 are disclosed herein with reference to FIG. 2.

Figure 3:
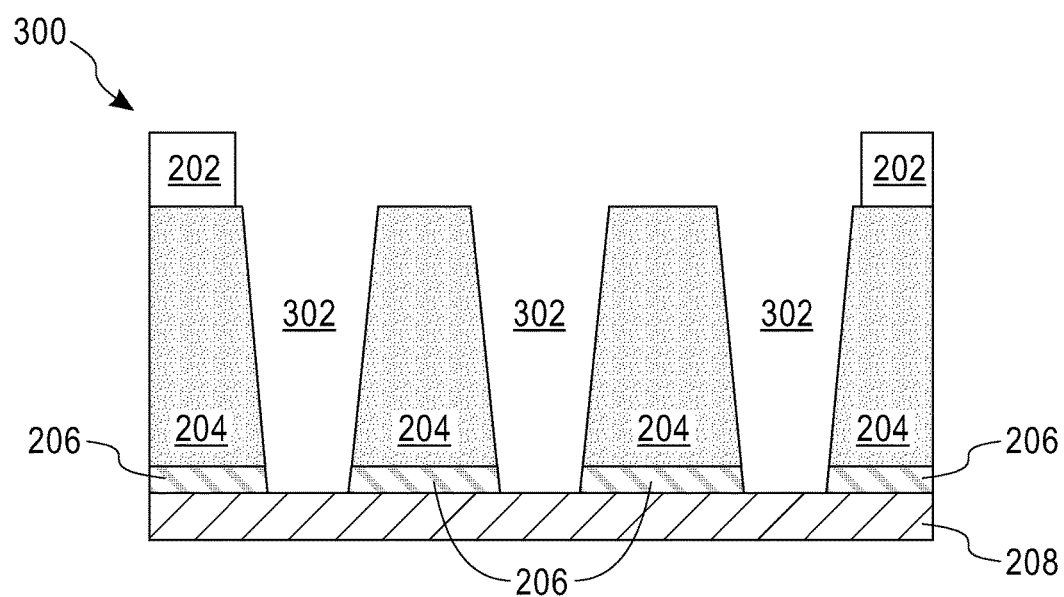
FIG. 3 is a cross-sectional view depicting a second opening operation for an embodiment of the method in FIG. 1.

Opening (115) a plurality of vias may include removing portions of the ULK layer and the cap layer by an RIE process to reveal the underlying conductive layer. Additional details of opening operation 115 are disclosed herein with reference to FIG. 3.

Figure 4:
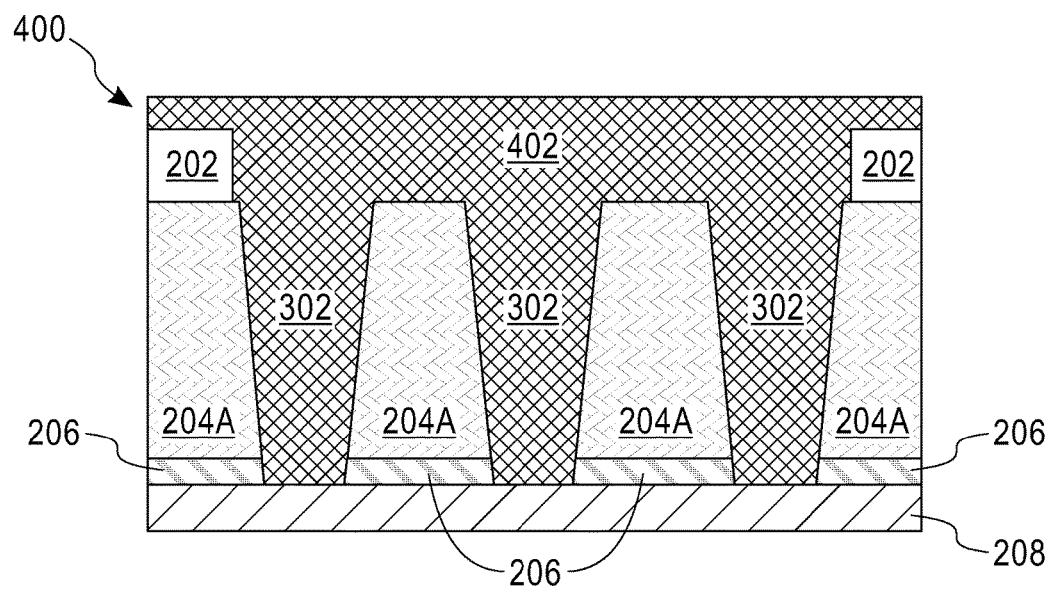
FIG. 4 is a cross-sectional view depicting a depositing operation for an embodiment of the method in FIG. 1.

Depositing (120) a pore filling material may include depositing (e.g., spinning on) a thermally decomposable polymer to form a plug fill in the vias. Additional details of depositing operation 120 are disclosed herein with reference to FIG. 4.

Annealing (125) may include heating the substrate to harden the pore filling material and drive the pore filling material into the pores of the ULK layer. Annealing may be conducted above the glass transition temperature of the specific thermally decomposable polymer used. The annealing temperature may further be based on pore size, wherein smaller pores require higher temperatures. In a non-limiting example, annealing may be conducted at approximately 200° C.

Controlling (130) the plug height may include conducting an optional plug height tuning etch. For example, if the ULK layer and the pore filling material have different etch selectivities, patterning and etching operation 135 (described herein) may be conducted as two separate operations, where controlling operation 130 is conducted first to etch the plug fills specifically. If, in an embodiment, patterning and etching operation 135 can be conducted to remove both the ULK layer and the pore filling material simultaneously, then controlling operation 130 may be omitted.

Figure 5:
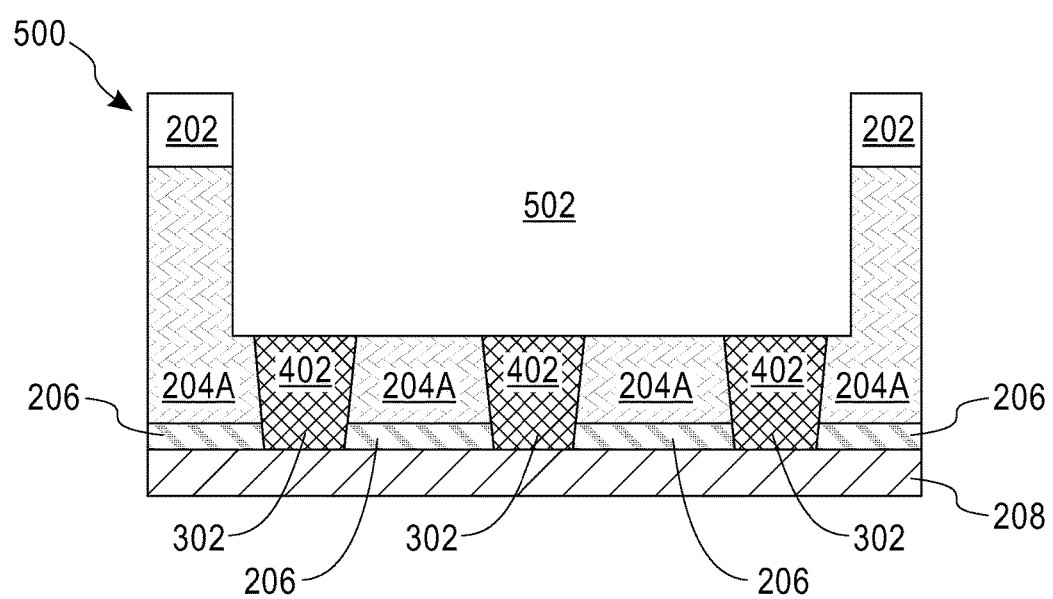
FIG. 5 is a cross-sectional view depicting a patterning and etching operation for an embodiment of the method in FIG. 1.

Patterning and etching (135) a trench may include opening the trench by an RIE process, wherein respective portions of the ULK layer and the pore filling material are removed coincident with the vias. The hard mask layer may protect portions of the ULK layer from etching during the patterning and etching operation 135. Additional details of patterning and etching operation 135 are described herein with reference to FIG. 5.

Figure 6:
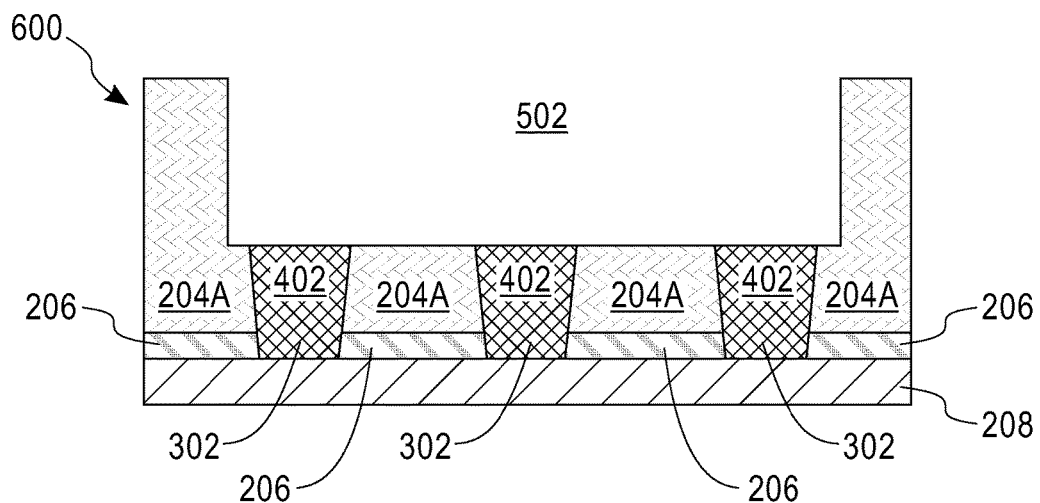
FIG. 6 is a cross-sectional view depicting a removing operation for an embodiment of the method in FIG. 1.

Removing (140) the hard mask layer may include removing the $SiO_2$, SiCOH, TiN, SiN, and/or other hard mask material included in receiving operation 105. Additional details of removing operation 140 are described herein with reference to FIG. 6.

Dissipating (145) the pore filling material may include dissipating (e.g., decomposing) both the portions of the plug fill in the vias and the pore filling material in the pores of the ULK layer. Dissipating operation 145 may include, for example but without limitation, a thermal anneal process, a UV cure process, and/or a plasma assisted anneal process.

Factors influencing the selection of a dissipation strategy may include, for example but without limitation: (i) molecular weight of the pore filling material; (ii) the possibility that a plasma assisted anneal process could damage the ULK; and/or (iii) the possibility that a UV anneal process and a plasma assisted anneal process each may not yield as low a dielectric constant (k value) as a thermal anneal process (further described herein with reference to FIG. 9).

Figure 7:
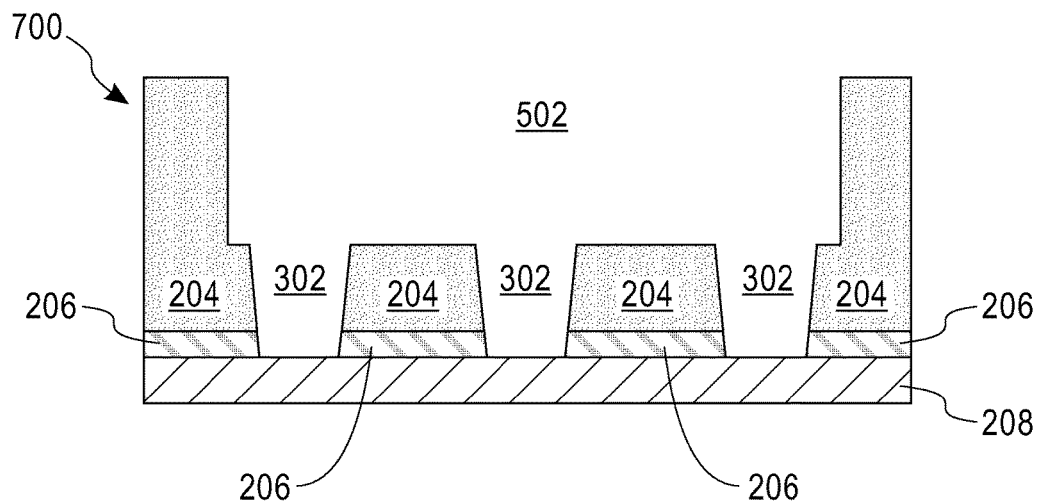
FIG. 7 is a cross-sectional view depicting a dissipating operation for an embodiment of the method in FIG. 1.

Dissipating operation 145 may be conducted at a temperature of, for example but without limitation, approximately 350° C. or 400° C. A temperature above 400° C. would not ordinarily be desirable, due to the possible presence of exposed copper. Additional details of dissipating operation 145 are disclosed herein with reference to FIG. 7.

Figure 8:
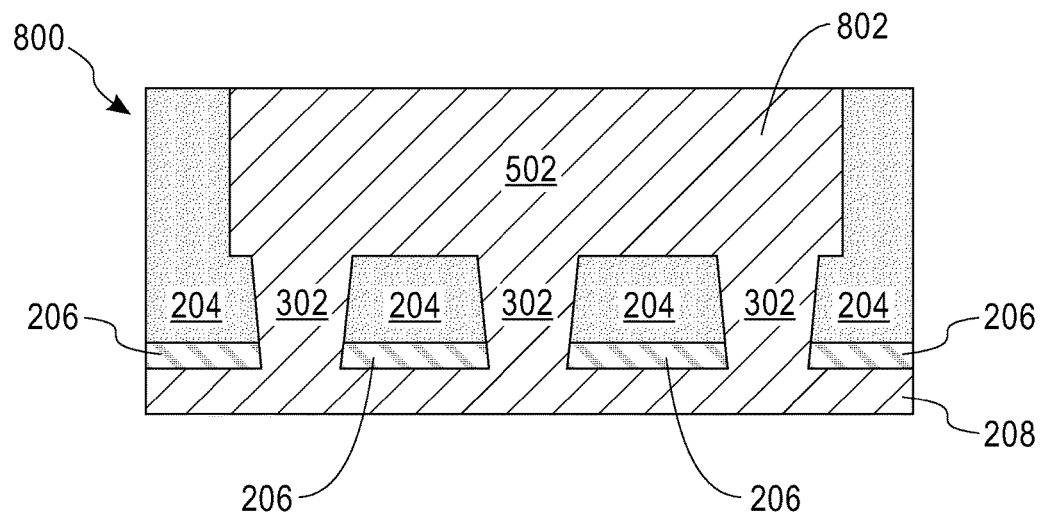
FIG. 8 is a cross-sectional view depicting a filling operation for an embodiment of the method in FIG. 1.

Filling (150) the trench may include metallization with a conductive (e.g., copper) liner fill. Filling operation 150 may also include chemical-mechanical polishing. Additional details of filling operation 150 are disclosed herein with reference to FIG. 8.

FIGS. 2-8 are cross-sectional views depicting operations of method 100 at various stages of processing, in accordance with an embodiment of the present invention. As shown in cross-sectional view 200 (FIG. 2), a portion of hard mask layer 202 may be removed to define the opening of a trench (not shown). Opening operation 110 reveals a portion of ULK layer 204, which underlies hard mask layer 202. Cap layer 206 underlies ULK layer 204 and separates ULK layer 204 from conductive layer 208.

As shown in cross-sectional view 300 (FIG. 3), vias 302 may be formed to extend through ULK layer 204 and cap layer 206, revealing portions of underlying conductive layer 208.

As shown in cross-sectional view 400 (FIG. 4), a pore filling material 402 may be deposited into vias 302 to form a plug fill and an enhanced ULK layer 204A, wherein pores of ULK layer 204 (not shown) are filled to protect ULK layer 204A during subsequent etching. For example, a spin-on process may be employed to deposit pore filling material 402 into vias 302.

As shown in cross-sectional view 500 (FIG. 5), a trench 502 may be patterned and etched coincident with vias 302. For example, trench 502 may be etched by removing portions of ULK layer 204A and pore filling material 302.

As shown in cross-sectional view 600 (FIG. 6), hard mask layer 202 (not shown) may be removed after formation of trench 502.

As shown in cross-sectional view 700 (FIG. 7), pore filling material 402 (not shown) may be dissipated by a thermal anneal process, UV anneal process, and/or a plasma assisted anneal process, such that the plug fill is removed and ULK layer 204 is restored to a porous state.

As shown in cross-sectional view 800 (FIG. 8), vias 302 and trench 502 may be filled with a conductive material 802. Conductive material 802 may be, for example but without limitation, copper that is deposited into vias 302 and trench 502 as part of a metallization and chemical-mechanical polishing process.

In addition to the steps and operations disclosed herein, additional steps and operations may be performed while retaining the spirit and intent of the disclosed embodiments. In a non-limiting example, operations of method 100 may be performed as part of the production of three-dimensional integrated circuits. In the same example, silicon wafers (not shown) may be stacked and vertically interconnected by vias 302, such that a single silicon wafer acts as a level of wiring, wherein trench 502 acts as a horizontal wiring and vias 302 act as vertical wiring.

Embodiments of the present invention may recognize one or more of the following facts, potential problems and/or potential areas for improvement with respect to the current state of the art: (i) according to conventional methods, vias are patterned first and a trench is etched subsequently, and etching the trench can damage the vias; (ii) uniformity issues can result from the spin-on process; (iii) wet clean methods can leave residues; (iv) wet chemistry can damage the ULK layer; and/or (v) there has been a failure to identify a via plug fill and wet removal combination that meets current needs.

Embodiments of the present invention may include one or more of the following features, characteristics, and/or advantages: (i) the pore filling material: (a) provides protection to the ULK during trench etching and ashing, (b) prevents critical dimension (CD) change in the trench due to damage, (c) prevents change in k of the ULK layer after the dissipation process, (d) prevents chamfer variation based on via density (less nested/density variation in plug fill thickness due to pore filling), and/or (e) along with the plug fill, protects the via chamfer at the trench-to-via corner; and/or (ii) use of a thermally decomposable material eliminates the need for wet clean.

Figure 9:
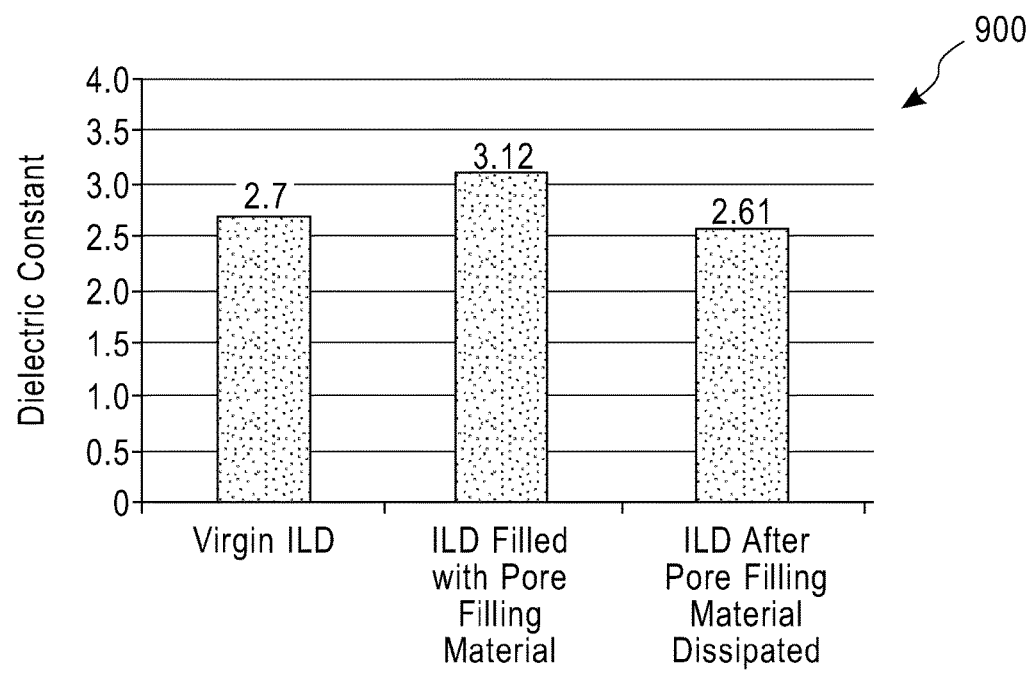
FIG. 9 shows experimental data related to an embodiment of the present invention.

As shown in FIG. 9, the k value of the ULK layer after dissipating operation 145 may be close to the k value observed at receiving operation 105. Graph 900 shows experimental data, in accordance with an embodiment of the present invention. Graph 900 shows respective k values for a ULK material prior to pore filling (2.7), in combination with pore filling material (3.12), and after dissipation of the pore filling material (2.61), where the original k value is restored after dissipating operation 145.

It should be noted that this description is not intended to limit the invention. On the contrary, the embodiments presented are intended to cover some of the alternatives, modifications, and equivalents, which are included in the spirit and scope of the invention as defined by the appended claims. Further, in the detailed description of the disclosed embodiments, numerous specific details are set forth in order to provide a comprehensive understanding of the claimed invention. However, one skilled in the art would understand that various embodiments may be practiced without such specific details.

Although the features and elements of the embodiments disclosed herein are described in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for forming chamferless vias, the method comprising:
    receiving a substrate stack comprising a hard mask layer, a porous dielectric layer underlying the hard mask layer, a cap layer underlying the dielectric layer, and a conductive layer underlying the cap layer;
    opening a portion of the hard mask layer to reveal a portion of the dielectric layer;
    opening a plurality of vias to extend through the dielectric layer and the cap layer;
    depositing into the vias a pore filling material comprising a thermally decomposable polymer wherein the pore filling material alone and the dielectric layer containing the pore filling material have different etch selectivities;
    annealing to harden the pore filling material in the vias and drive the pore filling material into pores of the dielectric layer adjacent to the vias;
    patterning and etching a trench coincident with the vias wherein etching the trench further comprises selectively etching the pore filling material in the vias to control a plug height of the pore filling material;
    removing the hard mask layer; and
    conducting a dissipation process to remove the pore filling material.

2. The method of claim 1, wherein the dielectric layer comprises an ultra-low-k dielectric.

3. The method of claim 1, wherein the thermally decomposable polymer is selected to fill the pores of the dielectric layer in response to annealing.

4. The method of claim 1, wherein annealing comprises heating the pore filling material to a temperature above a glass transition point of the pore filling material.

5. The method of claim 4, wherein the temperature is approximately 200° C.

6. The method of claim 1, wherein etching the trench comprises etching away a portion of the dielectric layer containing the pore filling material and a portion of the pore filling material.

7. The method of claim 1, wherein the hard mask layer comprises one or more of $SiO_2$, SiCOH, TiN, and SiN.

8. The method of claim 1, wherein the dissipation process occurs at a temperature not higher than approximately 400° C.

9. The method of claim 1, wherein the dissipation process occurs at or above approximately 350° C.

10. The method of claim 1, wherein the dissipation process comprises one or more of a thermal anneal process, a UV anneal process, and a plasma assisted anneal process.

11. The method of claim 1, further comprising:
    filling the trench with a conductive material.

* * * * *